(12) United States Patent
Kanaya et al.

(10) Patent No.: US 10,825,808 B2
(45) Date of Patent: Nov. 3, 2020

(54) ZENER DIODE WITH SEMICONDUCTOR REGION ANNULARLY SURROUNDING ANODE

(71) Applicant: ROHM CO., LTD., Kyoto (JP)

(72) Inventors: Toshiyuki Kanaya, Kyoto (JP); Tsuyoshi Hosono, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 24 days.

(21) Appl. No.: 16/127,904

(22) Filed: Sep. 11, 2018

(65) Prior Publication Data
US 2019/0081040 A1 Mar. 14, 2019

(30) Foreign Application Priority Data

Sep. 13, 2017 (JP) ................................. 2017-175992
Sep. 7, 2018 (JP) ................................. 2018-167959

(51) Int. Cl.
*H01L 21/70* (2006.01)
*H01L 27/07* (2006.01)
(Continued)

(52) U.S. Cl.
CPC ........ *H01L 27/0727* (2013.01); *H01L 21/762* (2013.01); *H01L 21/76224* (2013.01);
(Continued)

(58) Field of Classification Search
CPC . H01L 27/0727; H01L 29/10; H01L 27/0629; H01L 27/11563; H01L 29/866;
(Continued)

(56) References Cited

U.S. PATENT DOCUMENTS 9,293,605 B2 * 3/2016 Yamamoto ............ H01L 29/747
2011/0175199 A1 * 7/2011 Lin ..................... H01L 29/0646
257/605

FOREIGN PATENT DOCUMENTS

JP H7-106604 4/1995

* cited by examiner

*Primary Examiner* — Allen L Parker
*Assistant Examiner* — Wasiul Haider
(74) *Attorney, Agent, or Firm* — Rabin & Berdo, P.C.

(57) ABSTRACT

The semiconductor device includes a semiconductor layer having a main surface, a first semiconductor region of a first conductivity type formed in a surface layer portion of the main surface of the semiconductor layer, a second semiconductor region of a second conductivity type formed in a surface layer portion of the first semiconductor region and forming a zener diode with the first semiconductor region, a third semiconductor region of the first conductivity type formed in the surface layer portion of the first semiconductor region separated from the second semiconductor region, a fourth semiconductor region of the second conductivity type formed in a region between the second semiconductor region and the third semiconductor region in the surface layer portion of the first semiconductor region and having a second conductivity type impurity concentration less than a second conductivity type impurity concentration of the second semiconductor region, and an insulating layer formed on the main surface of the semiconductor layer and covering the second semiconductor region, the third semiconductor region and the fourth semiconductor region.

8 Claims, 20 Drawing Sheets

(51) Int. Cl.
*H01L 27/11563* (2017.01)
*H01L 29/866* (2006.01)
*H01L 21/762* (2006.01)
*H01L 29/66* (2006.01)
*H01L 29/10* (2006.01)
*H01L 27/06* (2006.01)
H01L 21/225 (2006.01)
H01L 21/04 (2006.01)
H01L 29/06 (2006.01)

(52) U.S. Cl.
CPC .... *H01L 27/0629* (2013.01); *H01L 27/11563* (2013.01); *H01L 29/10* (2013.01); *H01L 29/66106* (2013.01); *H01L 29/866* (2013.01); H01L 21/0465 (2013.01); H01L 21/2253 (2013.01); H01L 29/0615 (2013.01); H01L 29/0619 (2013.01); H01L 29/0646 (2013.01); H01L 29/0692 (2013.01)

(58) Field of Classification Search
CPC ........... H01L 29/66106; H01L 29/0646; H01L 29/0692; H01L 29/0619; H01L 29/0615
See application file for complete search history.

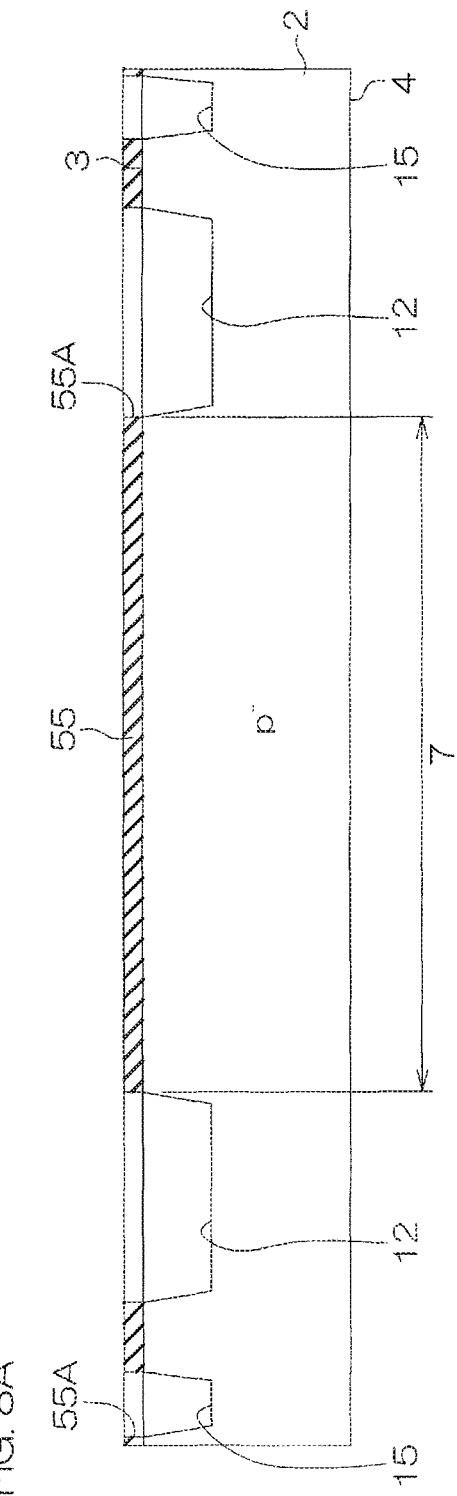

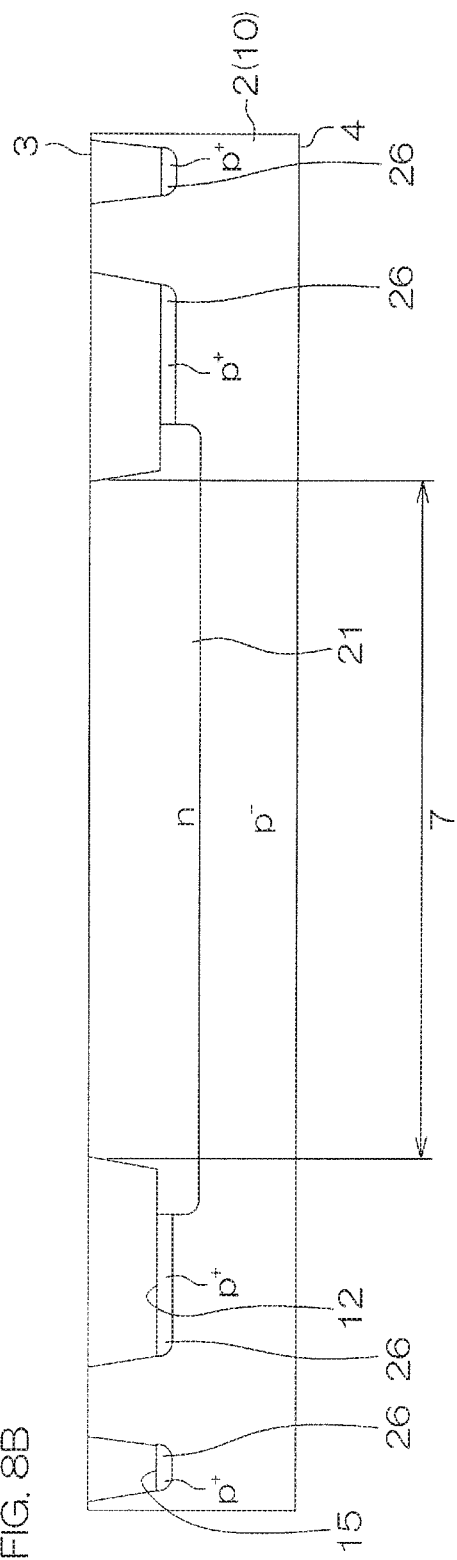

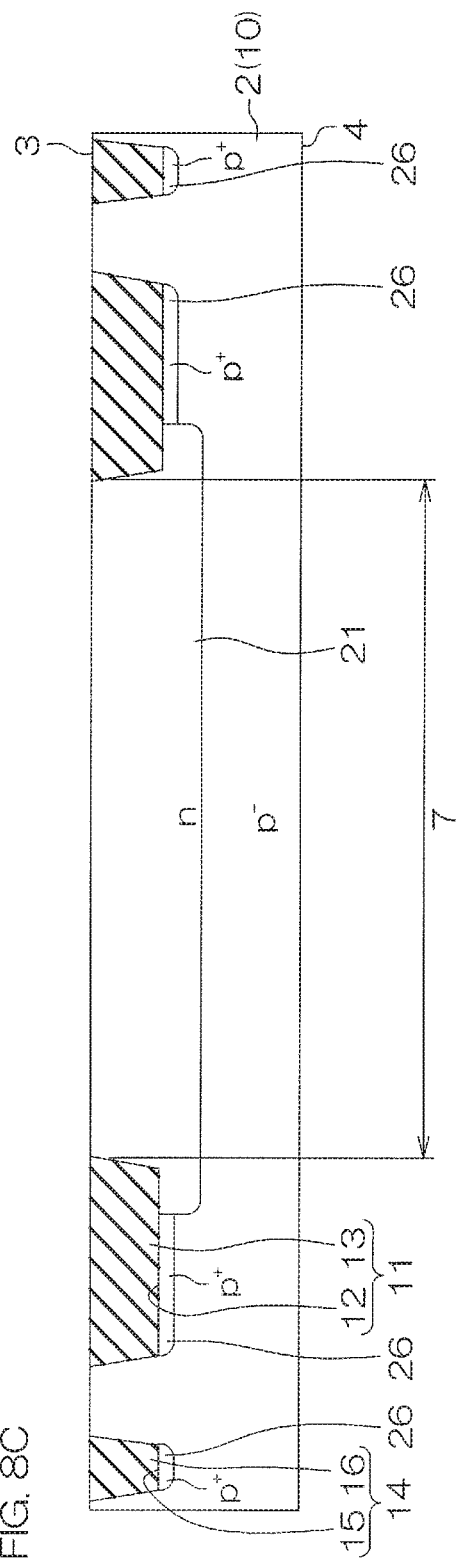

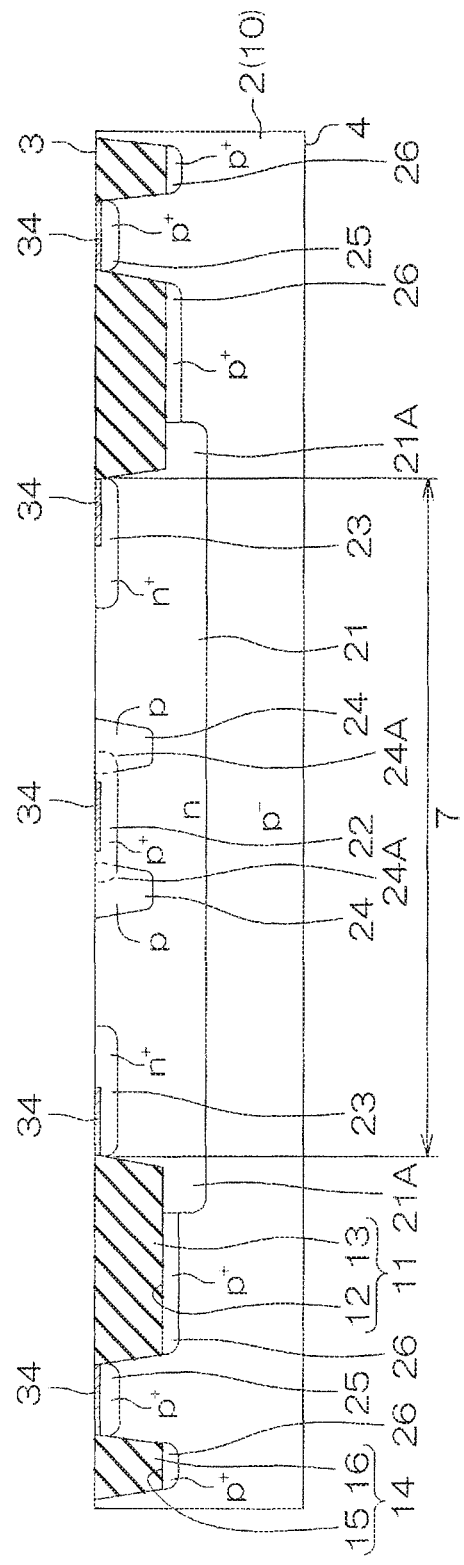

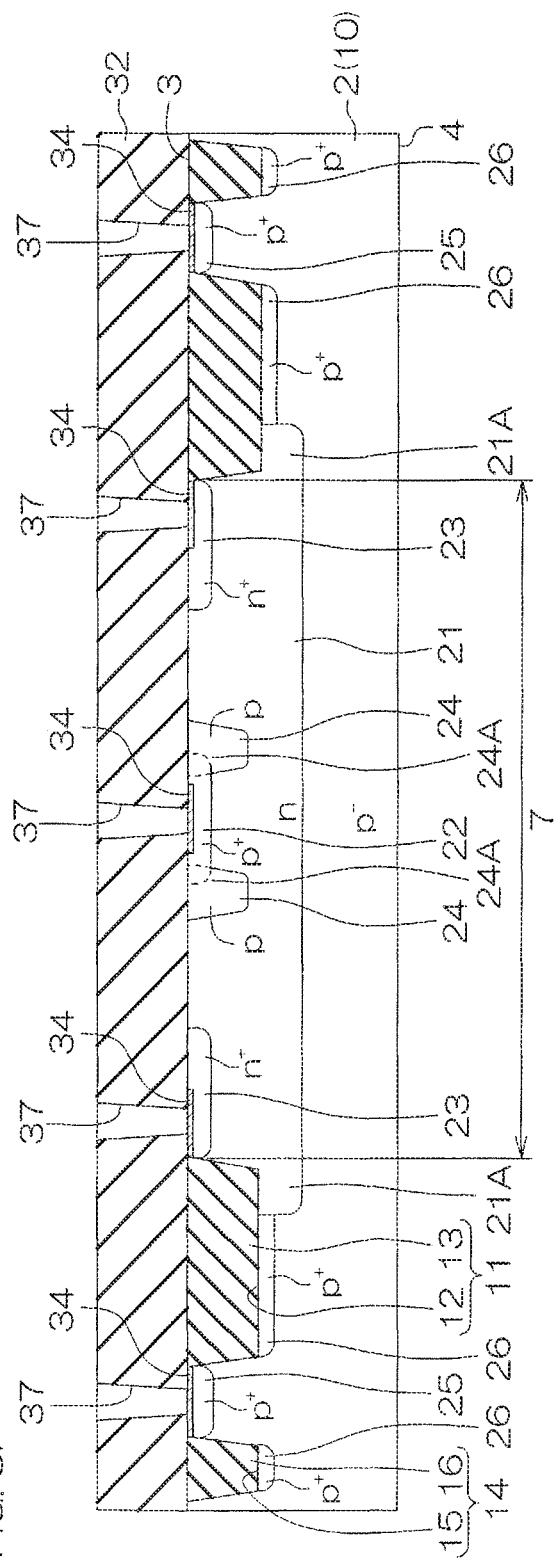

ZENER DIODE WITH SEMICONDUCTOR REGION ANNULARLY SURROUNDING ANODE

CROSS REFERENCE TO RELATED APPLICATIONS

This application claims the benefit of priority to Japanese Patent Application No. 2017-175992 filed in the Japan Patent Office on Sep. 13, 2017 and Japanese Patent Application No. 2018-167959 filed in the Japan Patent Office on Sep. 7, 2018. The entire contents of these applications are hereby incorporated herein by reference.

BACKGROUND OF THE INVENTION

1. Field of the Invention

The present invention relates to a semiconductor device and a manufacturing method thereof.

2. Description of the Related Art

U.S. Pat. No. 5,486,486A discloses a semiconductor device including a zener diode. The semiconductor device includes a semiconductor substrate having a main surface. An n-type well region is formed in a surface layer portion of the main surface of the semiconductor substrate.

A p-type semiconductor region is formed in a surface layer portion of the n-type well region. The p-type semiconductor region forms a zener diode with the n-type well region. An n-type semiconductor region is formed in the surface layer portion of the n-type well region separated from the p-type semiconductor region. An insulating layer is formed on the main surface of the semiconductor substrate. The insulating layer covers a region between the p-type semiconductor region and the n-type semiconductor region.

SUMMARY OF THE INVENTION

One preferred embodiment of the present invention provides a semiconductor device including a semiconductor layer having a main surface, a first semiconductor region of a first conductivity type formed in a surface layer portion of the main surface of the semiconductor layer, a second semiconductor region of a second conductivity type formed in a surface layer portion of the first semiconductor region and forming a zener diode with the first semiconductor region, a third semiconductor region of the first conductivity type formed in the surface layer portion of the first semiconductor region separated from the second semiconductor region, a fourth semiconductor region of the second conductivity type formed in a region between the second semiconductor region and the third semiconductor region in the surface layer portion of the first semiconductor region and having a second conductivity type impurity concentration less than a second conductivity type impurity concentration of the second semiconductor region, and an insulating layer formed on the main surface of the semiconductor layer and covering the second semiconductor region, the third semiconductor region and the fourth semiconductor region.

One preferred embodiment of the present invention provides a manufacturing method of a semiconductor device including steps of preparing a semiconductor layer having a main surface, forming a first semiconductor region of a first conductivity type in a surface layer portion of the main surface of the semiconductor layer, forming a second semiconductor region of a second conductivity type, a third semiconductor region of the first conductivity type, and a fourth semiconductor region of the second conductivity type in a surface layer portion of the first semiconductor region, the second semiconductor region forming a zener diode with the first semiconductor region, the third semiconductor region formed in a region separated from the second semiconductor region, and the fourth semiconductor region formed in a region between the second semiconductor region and the third semiconductor region and having a second conductivity type impurity concentration less than a second conductivity type impurity concentration of the second semiconductor region, and forming an insulating layer covering the second semiconductor region, the third semiconductor region and the fourth semiconductor region on the main surface of the semiconductor layer.

The above and other elements, features, characteristics and advantages of the present invention will become more apparent from the following detailed description of the preferred embodiments with reference to the attached drawings.

BRIEF DESCRIPTION OF THE DRAWINGS

FIGS. 8A to 8H are sectional views for explaining an example of a manufacturing method of the semiconductor device shown in FIG. 1.

DETAILED DESCRIPTION OF THE PREFERRED EMBODIMENTS

Figure 1:
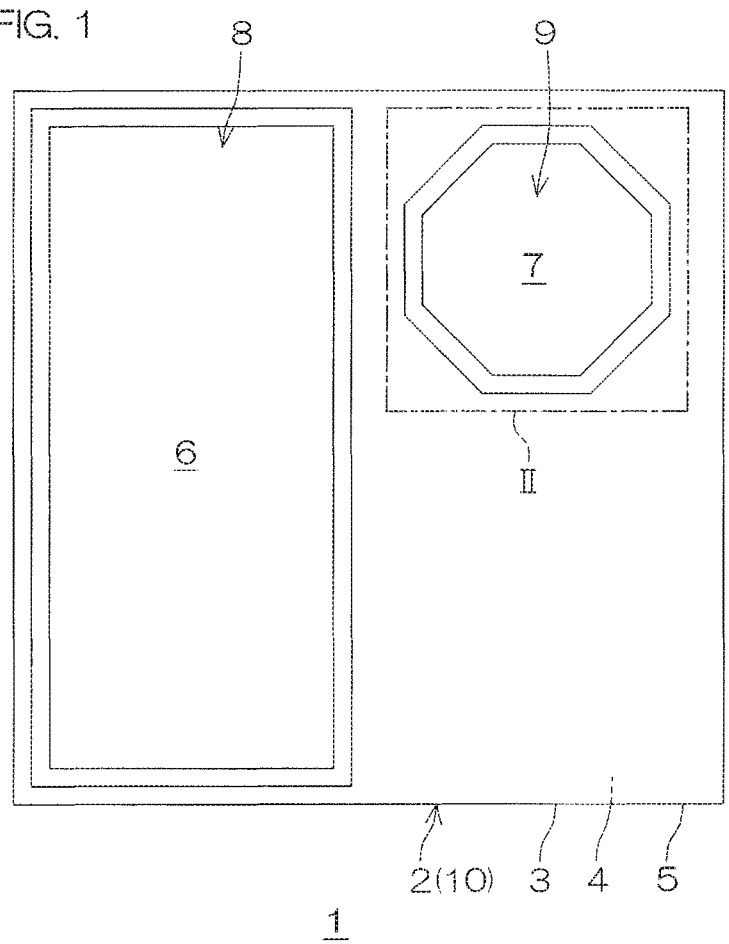
FIG. 1 is a plan view showing a semiconductor device according to a first preferred embodiment of the present invention.

In the conventional semiconductor device disclosed in U.S. Pat. No. 5,486,486A, there was a problem that a breakdown voltage fluctuated when a reverse bias voltage was continuously applied to the zener diode. As a result of intensive studies on this problem, the inventors of the present invention found that an impurity level occurring in the insulating layer formed on the main surface of the semiconductor substrate is one of causes.

More specifically, when the reverse bias voltage is continuously applied to the zener diode, a current flows in a region between the p-type semiconductor region and the n-type semiconductor region. A part of electric charges forming the current flows in a surface layer portion of the n-type well region at a region between the p-type semiconductor region and the n-type semiconductor region and is trapped by the insulating layer. As a result, the impurity level is formed in the insulating layer, and the breakdown voltage of the zener diode fluctuates.

One preferred embodiment of the present invention provides a semiconductor device capable of suppressing a fluctuation in a breakdown voltage and a manufacturing method thereof.

One preferred embodiment of the present invention provides a semiconductor device including a semiconductor layer having a main surface, a first semiconductor region of a first conductivity type formed in a surface layer portion of the main surface of the semiconductor layer, a second semiconductor region of a second conductivity type formed in a surface layer portion of the first semiconductor region and forming a zener diode with the first semiconductor region, a third semiconductor region of the first conductivity type formed in the surface layer portion of the first semiconductor region separated from the second semiconductor region, a fourth semiconductor region of the second conductivity type formed in a region between the second semiconductor region and the third semiconductor region in the surface layer portion of the first semiconductor region and having a second conductivity type impurity concentration less than a second conductivity type impurity concentration of the second semiconductor region, and an insulating layer formed on the main surface of the semiconductor layer and covering the second semiconductor region, the third semiconductor region and the fourth semiconductor region.

According to the semiconductor device, when a reverse bias voltage is applied to the zener diode, a current flows through a region between the second semiconductor region and the third semiconductor region so as to bypass the fourth semiconductor region.

The current flowing in the surface layer portion of the first semiconductor region can thus be suppressed, so that a part of electric charges can be suppressed from being captured by the insulating layer. As a result, it is possible to suppress a formation of an impurity level in the insulating layer. It is therefore possible to provide the semiconductor device capable of suppressing a fluctuation of a breakdown voltage.

One preferred embodiment of the present invention provides a manufacturing method of a semiconductor device including steps of preparing a semiconductor layer having a main surface, forming a first semiconductor region of a first conductivity type in a surface layer portion of the main surface of the semiconductor layer, forming a second semiconductor region of a second conductivity type, a third semiconductor region of the first conductivity type, and a fourth semiconductor region of the second conductivity type in a surface layer portion of the first semiconductor region, the second semiconductor region forming a zener diode with the first semiconductor region, the third semiconductor region formed in a region separated from the second semiconductor region, and the fourth semiconductor region formed in a region between the second semiconductor region and the third semiconductor region and having a second conductivity type impurity concentration less than a second conductivity type impurity concentration of the second semiconductor region, and forming an insulating layer covering the second semiconductor region, the third semiconductor region and the fourth semiconductor region on the main surface of the semiconductor layer.

According to the manufacturing method, a semiconductor device having a structure in which the fourth semiconductor region of the second conductivity type is formed in the region between the second semiconductor region and the third semiconductor region in the surface layer portion of the first semiconductor region can be manufactured.

The second semiconductor region forms the zener diode with the first semiconductor region. The fourth semiconductor region has the second conductivity type impurity concentration less than the second conductivity type impurity concentration of the second semiconductor region.

According to the semiconductor device, in a case where a reverse bias voltage is applied to the zener diode, a current flows through a region between the second semiconductor region and the third semiconductor region so as to bypass the fourth semiconductor region.

The current flowing in the surface layer portion of the first semiconductor region can thus be suppressed, so that a part of electric charges can be suppressed from being captured by the insulating layer. As a result, it is possible to suppress a formation of an impurity level in the insulating layer. It is therefore possible to manufacture and provide the semiconductor device capable of suppressing a fluctuation of a breakdown voltage.

Hereinafter, embodiments of the present invention will be described with reference to the accompanying drawings.

Figure 2:
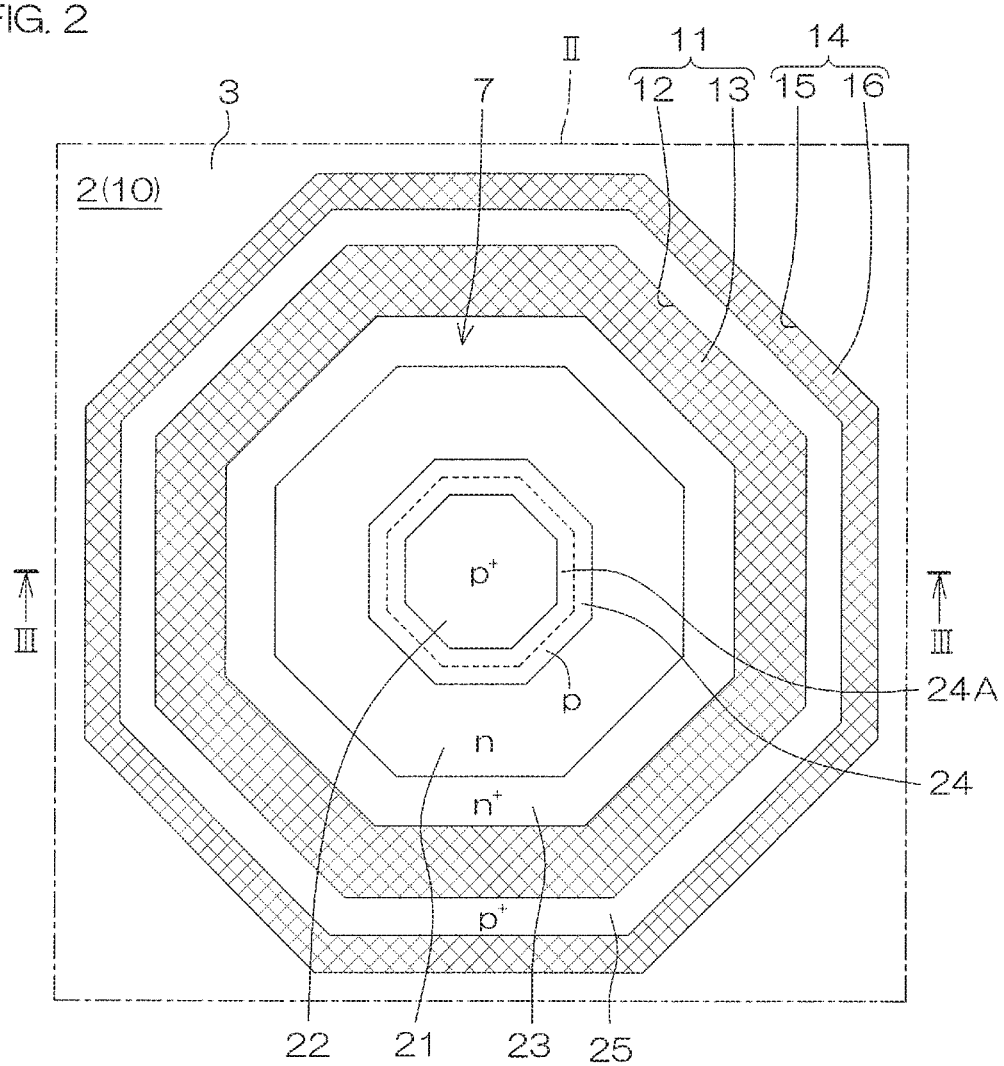
FIG. 2 is an enlarged view of a region II shown in FIG. 1.
Figure 3:
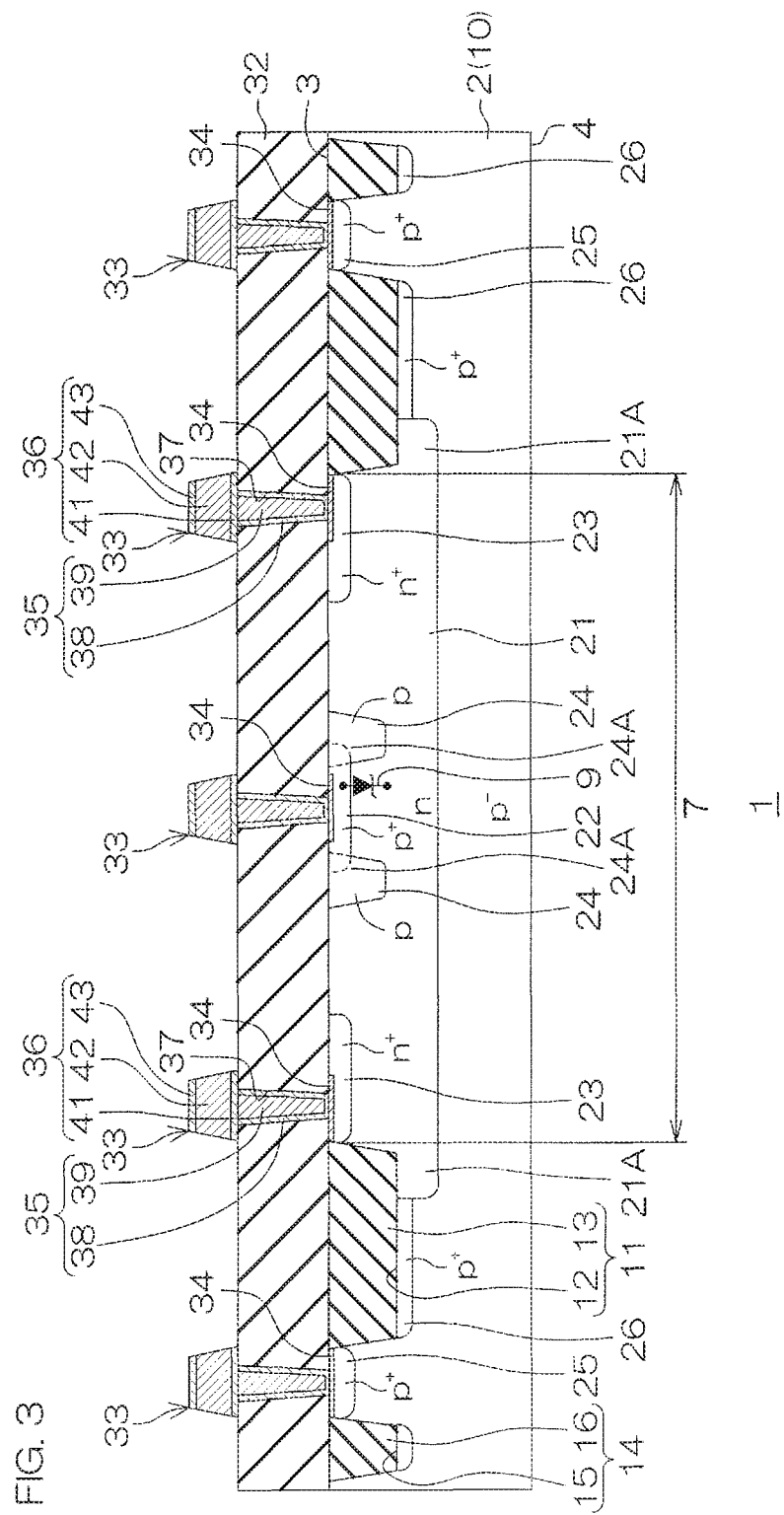
FIG. 3 is a sectional view taken along line III-III shown in FIG. 2.

FIG. 1 is a plan view showing a semiconductor device 1 according to a first preferred embodiment of the present invention. FIG. 2 is an enlarged view of a region II shown in FIG. 1. FIG. 3 is a sectional view taken along line III-III shown in FIG. 2.

Referring to FIG. 1, the semiconductor device 1 includes a semiconductor layer 2 formed in a rectangular parallelepiped shape. The semiconductor layer 2 has a first main surface 3 on one side, a second main surface 4 on the other side and a lateral surface 5 connecting the first main surface 3 and the second main surface 4. The first main surface 3 and the second main surface 4 are formed in a quadrangular shape in a plan view when viewed from a normal direction thereof (hereinafter simply referred to as "the plan view").

A memory region 6 is formed in the first main surface 3 of the semiconductor layer 2. A diode region 7 as an example of a device forming region is formed in the first main surface 3 of the semiconductor layer 2. An Electrically Erasable Programmable Read Only Memory 8 (EEPROM 8) as an example is formed in the memory region 6. A zener diode 9 is formed in the diode region 7. The zener diode 9 limits and/or stabilizes a voltage supplied to the EEPROM 8, for example.

Referring to FIG. 2 and FIG. 3, the semiconductor layer 2 includes a semiconductor substrate 10 of p-type, in this embodiment. A p-type impurity concentration of the semiconductor substrate 10 may be equal to or more than $1.0 \times 10^{14}$ cm$^{-3}$ and equal to or less than $1.0 \times 10^{15}$ cm$^{-3}$. The semiconductor layer 2 may have a single layer structure composed of the semiconductor substrate 10. The semiconductor substrate 10 may be a semiconductor substrate made of silicon or silicon carbide (SiC).

A first device separation structure 11 is formed in the first main surface 3 of the semiconductor layer 2. The first device separation structure 11 is indicated by a hatching in FIG. 2 for clarity. The first device separation structure 11 defines the diode region 7.

The first device separation structure 11 extends in a strip shape along the diode region 7 in the plan view. The first device separation structure 11 is formed in an annular shape surrounding the diode region 7 in the plan view. The first device separation structure 11 is formed in an octagonal annular shape in this embodiment. The diode region 7 is thus defined in an octagonal shape.

The diode region 7 may be defined in a polygonal shape other than the octagonal shape such as a quadrangular shape, a hexagonal shape, a decagonal shape, or the like in the plan view, depending on the shape of the first device separation structure 11. The diode region 7 may be defined in a circular shape or an elliptical shape in the plan view, depending on the shape of the first device separation structure 11.

The first device separation structure 11 has a first trench isolation structure in this embodiment. The first trench isolation structure includes a first trench 12 formed in the first main surface 3 of the semiconductor layer 2, and a first insulating layer 13 embedded in the first trench 12.

The first trench isolation structure is also called a Deep Trench Isolation (DTI) structure or a Shallow Trench Isolation (STI) structure according to a depth or an aspect ratio of the first trench 12. The depth of the first trench 12 (the first device separation structure 11) may be equal to or more than 0.5 μm and equal to or less than 0.7 μm.

A second device separation structure 14 is formed in an outside region of the first device separation structure 11 in the first main surface 3 of the semiconductor layer 2. The second device separation structure 14 is indicated by a hatching in FIG. 2 for clarity.

The second device separation structure 14 is formed at an interval form the first device separation structure 11. The first main surface 3 of the semiconductor layer 2 is exposed from a region between the first device separation structure 11 and the second device separation structure 14.

The second device separation structure 14 extends in a strip shape along the first device separation structure 11. The second device separation structure 14 is formed in an annular shape surrounding the first device separation structure 11. The second device separation structure 14 is formed in an octagonal annular shape. The second device separation structure 14 may be formed in a polygonal annular shape or a circular ring shape in the plan view, depending on the shape of the diode region 7 or the first device separation structure 11.

The second device separation structure 14 has a second trench isolation structure. The second trench isolation structure includes a second trench 15 formed in the first main surface 3 of the semiconductor layer 2, and a second insulating layer 16 embedded in the second trench 15.

The second trench isolation structure is also called a Deep Trench Isolation (DTI) structure or a Shallow Trench Isolation (STI) structure according to a depth or an aspect ratio of the second trench 15. The depth of the second trench 15 (the second device separation structure 14) may be equal to or more than 0.5 μm and equal to or less than 0.7 μm. The second trench 15 may be formed in the substantially same depth as the depth of the first trench 12.

A first semiconductor region 21 of n-type is formed in a surface layer portion of the first main surface 3 of the semiconductor layer 2 at the diode region 7. An n-type impurity concentration of the first semiconductor region 21 may be equal to or more than $1.0 \times 10^{17}$ cm$^{-3}$ and equal to or less than $1.0 \times 10^{19}$ cm$^{-3}$.

The first semiconductor region 21 is formed in a substantially whole region of the diode region 7 in the plan view. A bottom portion of the first semiconductor region 21 is positioned in a region of a side of the second main surface 4 of the semiconductor layer 2 with respect to a bottom portion of the first device separation structure 11. The first semiconductor region 21 includes an overwrap portion 21A covering the bottom portion of the first device separation structure 11. A thickness of the first semiconductor region 21 may be equal to or more than 1.2 μm and equal to or less than 1.8 μm.

A second semiconductor region 22 of p$^+$-type is formed in a surface layer portion of the first semiconductor region 21. The second semiconductor region 22 has a p-type impurity concentration more than the p-type impurity concentration of the semiconductor substrate 10. The p-type impurity concentration of the second semiconductor region 22 may be equal to or more than $1.0 \times 10^{17}$ cm$^{-3}$ and equal to or less than $1.0 \times 10^{20}$ cm$^{-3}$.

The second semiconductor region 22 is separated from an inner edge of the first device separation structure 11 to an inside of the diode region 7 and formed in an island shape. The second semiconductor region 22 is formed in a central portion of the diode region 7 in the plan view.

A bottom portion of the second semiconductor region 22 is positioned in a region between the first main surface 3 of the semiconductor layer 2 and the bottom portion of the first semiconductor region 21. A thickness of the second semiconductor region 22 may be equal to or more than 0.05 μm and equal to or less than 0.2 μm.

The second semiconductor region 22 forms a pn junction with the first semiconductor region 21. The zener diode 9 having the second semiconductor region 22 as an anode region and the first semiconductor region 21 as a cathode region is formed by the pn junction.

A third semiconductor region 23 of n$^+$-type is formed in the surface layer portion of the first semiconductor region 21. The third semiconductor region 23 has an n-type impurity concentration more than the n-type impurity concentration of the first semiconductor region 21. The n-type impurity concentration of the third semiconductor region 23 may be equal to or more than $1.0 \times 10^{17}$ cm$^{-3}$ and equal to or less than $1.0 \times 10^{20}$ cm$^{-3}$.

The third semiconductor region 23 extends in a strip shape along the inner edge of the first device separation structure 11. The third semiconductor region 23 may be formed in a strip shape having ends and extending along the inner edge of the first device separation structure 11. The third semiconductor region 23 is preferably formed in an annular shape surrounding the second semiconductor region 22, in the plan view. The third semiconductor region 23 may be in contact with a lateral wall portion of the first device separation structure 11.

A bottom portion of the third semiconductor region 23 is positioned in a region between the first main surface 3 of the semiconductor layer 2 and the bottom portion of the first semiconductor region 21. A thickness of the third semiconductor region 23 may be equal to or more than 0.05 μm and equal to or less than 0.2 μm.

A fourth semiconductor region 24 of p$^-$-type is formed in a region between the second semiconductor region 22 and the third semiconductor region 23 in the surface layer portion of the first semiconductor region 21. The fourth semiconductor region 24 has a p-type impurity concentration more than the p-type impurity concentration of the semiconductor substrate 10, and less than the p-type impurity concentration of the second semiconductor region 22.

The p-type impurity concentration of the fourth semiconductor region 24 may be equal to or more than $1.0 \times 10^{17}$ cm$^{-3}$ and equal to or less than $2.0 \times 10^{18}$ cm$^{-3}$. The fourth semiconductor region 24 may have a concentration gradient in which the p-type impurity concentration of a side of a bottom portion thereof is less than the p-type impurity concentration of a side of a surface layer portion thereof.

The fourth semiconductor region 24 is formed at interval from the third semiconductor region 23 to a side of the second semiconductor region 22. The fourth semiconductor region 24 extends in a strip shape along a peripheral portion of the second semiconductor region 22.

The fourth semiconductor region 24 may be formed in a strip shape having ends and extending along the peripheral portion of the second semiconductor region 22. The fourth semiconductor region 24 is preferably formed in an annular shape surrounding the second semiconductor region 22 in the plan view. The fourth semiconductor region 24 is connected to the second semiconductor region 22.

The bottom portion of the fourth semiconductor region 24 is positioned in a region of a side of the bottom portion of the first semiconductor region 21 with respect to the bottom portion of the second semiconductor region 22. The fourth semiconductor region 24 includes an overwrap portion 24A covering the bottom portion of the second semiconductor region 22.

A thickness of the fourth semiconductor region 24 may be equal to or more than 0.05 µm and equal to or less than 0.2 µm. A width of the fourth semiconductor region 24 in a direction orthogonal to a direction in which the fourth semiconductor region 24 extends may be equal to or more than 1.0 µm and equal to or less than 3.0 µm.

A fifth semiconductor region 25 of p$^+$-type is formed in a region between the first device separation structure 11 and the second device separation structure 14 in the surface layer portion of the first main surface 3 of the semiconductor layer 2. A p-type impurity concentration of the fifth semiconductor region 25 may be equal to or more than $1.0 \times 10^{17}$ cm$^{-3}$ and equal to or less than $1.0 \times 10^{20}$ cm$^{-3}$. The p-type impurity concentration of the fifth semiconductor region 25 may be substantially equal to the p-type impurity concentration of the second semiconductor region 22.

The fifth semiconductor region 25 is in contact with the first device separation structure 11 and the second device separation structure 14. A bottom portion of the fifth semiconductor region 25 is positioned in a region between the first main surface 3 of the semiconductor layer 2 and the bottom portion of the first device separation structure 11. A thickness of the fifth semiconductor region 25 may be equal to or more than 0.05 µm and equal to or less than 0.2 µm. The fifth semiconductor region 25 may have the substantially same thickness as the thickness of the second semiconductor region 22.

A sixth semiconductor region 26 of p$^+$-type is formed in a region along the bottom portion of the first device separation structure 11 in the semiconductor layer 2. The sixth semiconductor region 26 may have a p-type impurity concentration less than the p-type impurity concentration of the second semiconductor region 22, and more than the p-type impurity concentration of the fourth semiconductor region 24. The p-type impurity concentration of the sixth semiconductor region 26 may be equal to or more than $1.0 \times 10^{15}$ cm$^{-3}$ and equal to or less than $1.0 \times 10^{18}$ cm$^{-3}$.

The sixth semiconductor region 26 is connected to the first semiconductor region 21 in a region along the bottom portion of the first device separation structure 11 in the semiconductor layer 2. The sixth semiconductor region 26, more specifically, is connected to the overwrap portion 21A of the first semiconductor region 21.

A bottom portion of the sixth semiconductor region 26 is positioned in a region between the bottom portion of the first device separation structure 11 and the bottom portion of the first semiconductor region 21. The sixth semiconductor region 26 is also formed in a region along the bottom portion of the second device separation structure 14 in the semiconductor layer 2. A thickness of the sixth semiconductor region 26 may be equal to or more than 0.2 µm and equal to or less than 0.5 µm.

An insulating layer 32 is formed on the first main surface 3 of the semiconductor layer 2. The insulating layer 32 covers a substantially whole region of the diode region 7 on the first main surface 3 of the semiconductor layer 2. The insulating layer 32 covers the second semiconductor region 22, the third semiconductor region 23 and the fourth semiconductor region 24.

The insulating layer 32 may have a single layer structure composed of a single insulating layer. The insulating layer 32 may have a laminated layer structure in which a plurality of insulating layers is laminated. The insulating layer 32 may include at least one of silicon oxide or silicon nitride.

A plurality of terminal electrodes 33 is formed on the insulating layer 32. The plurality of terminal electrodes 33 is electrically connected to the second semiconductor region 22, the third semiconductor region 23 and the fifth semiconductor region 25 through a silicide layer 34, respectively. The terminal electrodes 33 respectively include a contact electrode layer 35 and a wiring electrode layer 36.

The contact electrode layer 35 is embedded in contact hall 37 formed in the insulating layer 32. The contact electrode layer 35 includes a base electrode layer 38 and an embedded electrode layer 39. The base electrode layer 38 may include titanium. The embedded electrode layer 39 may include tungsten.

The base electrode layer 38 is formed in a film shape along an inner wall surface of the contact hall 37. A recess space is thus formed inside the contact hall 37. The embedded electrode layer 39 is embedded in the recess space defined by the base electrode layer 38.

The wiring electrode layer 36 covers the contact electrode layer 35 on the insulating layer 32. The wiring electrode layer 36 has a laminated layer structure including a first electrode layer 41, a second electrode layer 42 and a third electrode layer 43 laminated in this order from a side of the contact electrode layer 35. The first electrode layer 41 may include titanium. The second electrode layer 42 may include aluminum. The third electrode layer 43 may include titanium.

Figure 4:
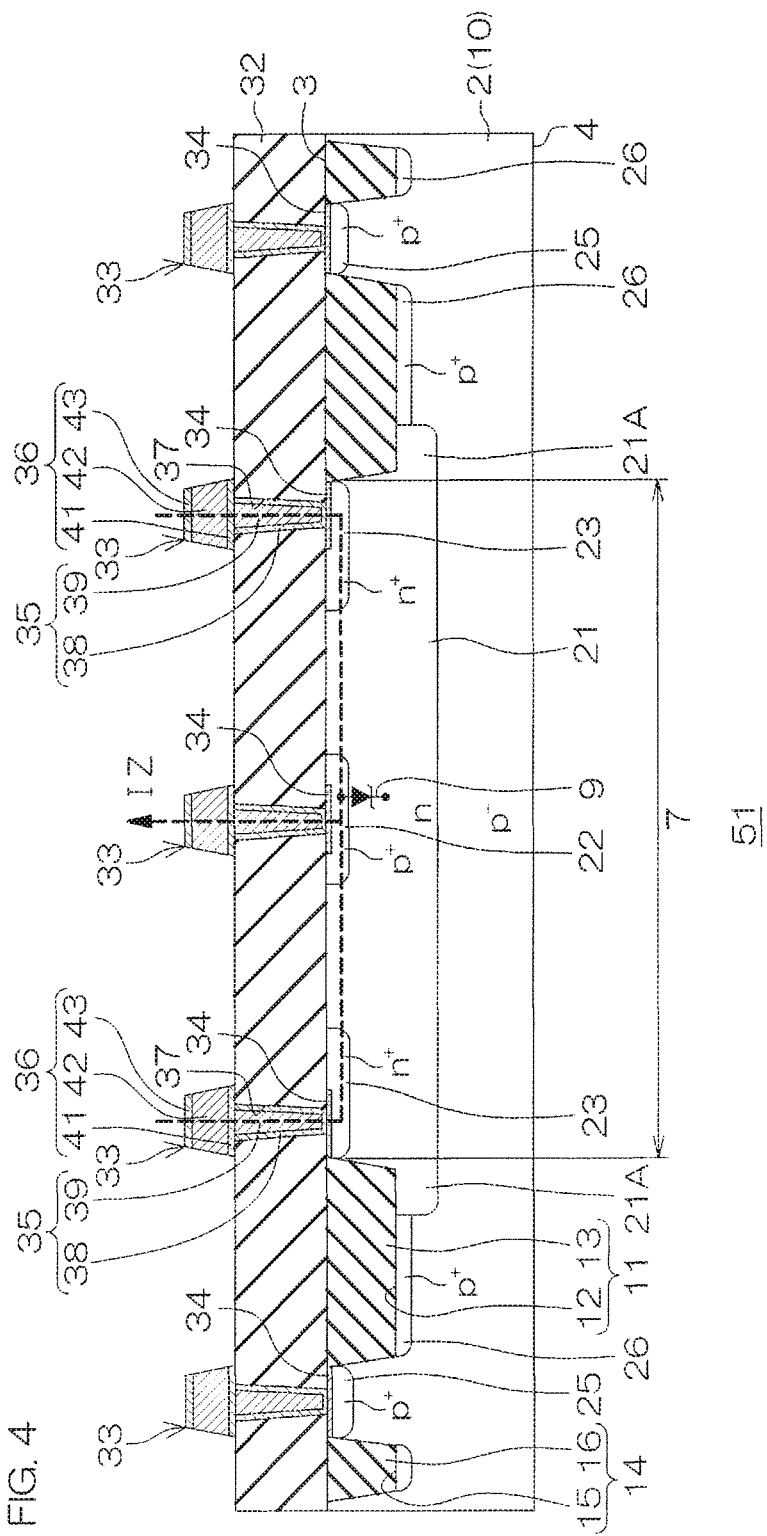
FIG. 4 is a sectional view of a semiconductor device according to a reference example.

FIG. 4 is a sectional view of a semiconductor device 51 according to a reference example. The semiconductor device 51 according to the reference example has the substantially same structures as the structures of the semiconductor device 1 except that the semiconductor device 51 is free from the fourth semiconductor region 24. In FIG. 4, the structures corresponding to the structures described for the semiconductor device 1 are denoted by the same reference numeral, and the descriptions thereof are omitted.

Referring to FIG. 4, a current IZ flows in a region between the second semiconductor region 22 and the third semiconductor region 23 when a revers bias voltage is applied to the zener diode 9 in the semiconductor device 51 according to the reference example.

A part of electric charges forming the current IZ flows the surface layer portion of the first semiconductor region 21 in the region between the second semiconductor region 22 and the third semiconductor region 23, and is captured by the insulating layer 32. An impurity level is therefore formed in the insulating layer 32, and a fluctuation of a breakdown voltage BV of the zener diode 9 is occurred. Electrons or holes may be included in the electric charges to be captured by the insulating layer 32.

Figure 5:
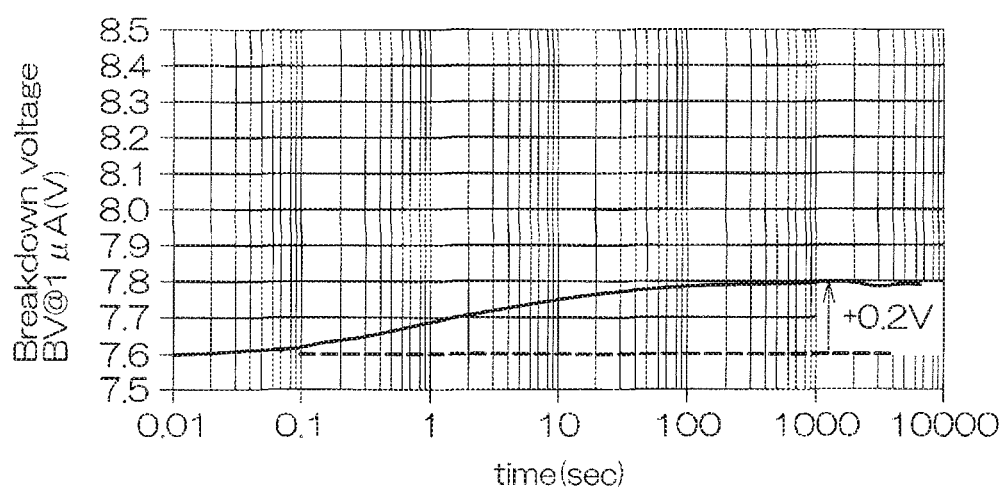
FIG. 5 is a graph obtained by a simulation, and showing a breakdown voltage of the semiconductor device shown in FIG. 4.

FIG. 5 is a graph obtained by a simulation, and showing the breakdown voltage BV of the semiconductor device 51 shown in FIG. 4. The vertical axis represents the breakdown voltage BV [V], and the horizontal axis represents the application time [seconds (sec)] of the reverse bias voltage in FIG. 5.

Referring to FIG. 5, in the semiconductor device 51 according to the reference example, a fluctuation of about +0.2 V in the breakdown voltage BV was observed when the reverse bias voltage was continuously applied for 1000 seconds. That is, in the semiconductor device 51 according to the reference example, an absolute value of a variation rate of the breakdown voltage BV when the reverse bias voltage was applied for 1000 seconds was equal to or more than 2.50%. From this result, it was found that the breakdown voltage BV was deteriorated with a passage of time in the semiconductor device 51 according to the reference example.

Figure 6:
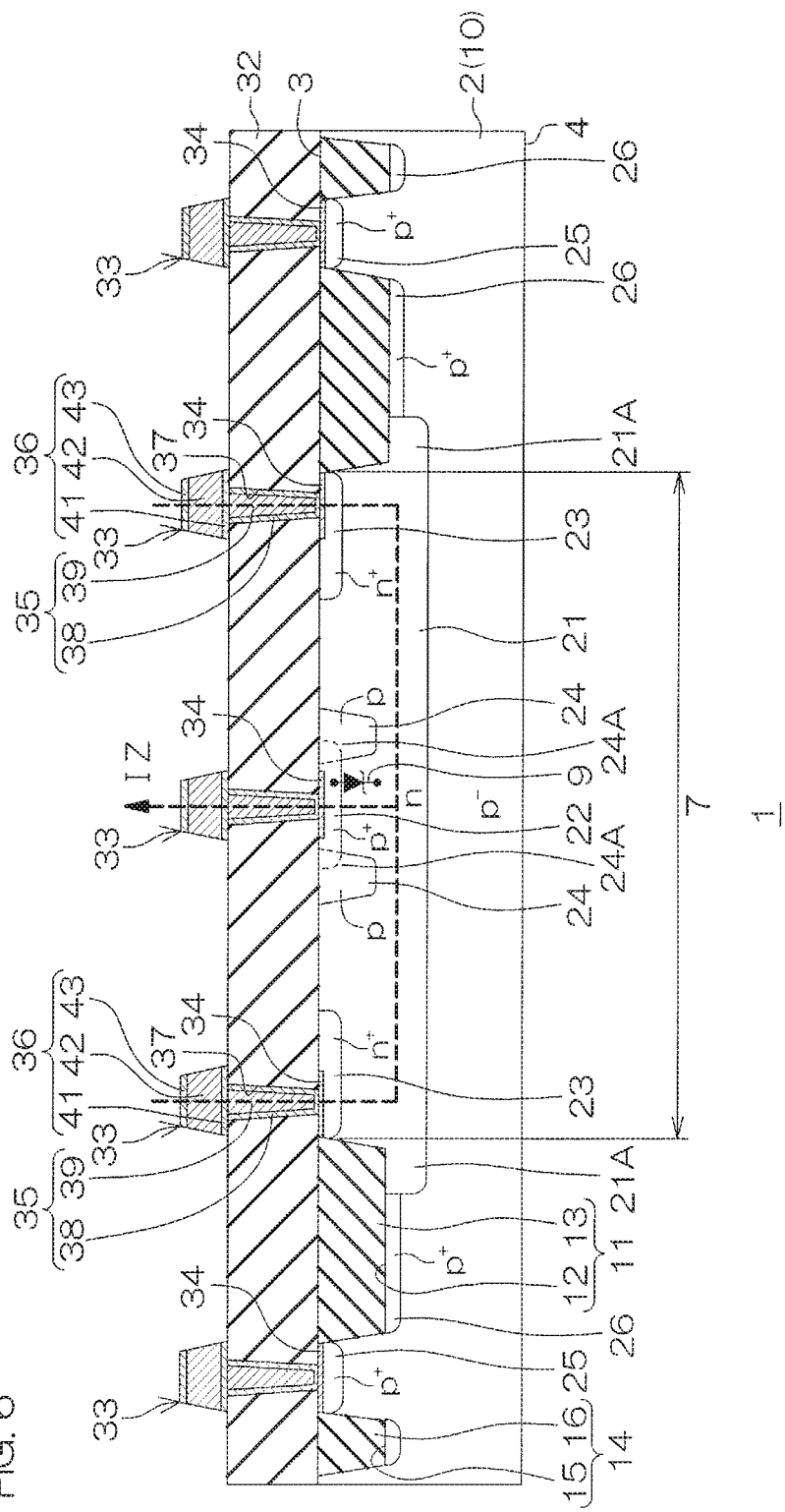
FIG. 6 is a sectional view for explaining a current path of the semiconductor device shown in FIG. 1.

FIG. 6 is a sectional view for explaining a current path of the semiconductor device 1 shown in FIG. 1.

Referring to FIG. 6, according to the semiconductor device 1, the fourth semiconductor region 24 of p-type is formed in the region between the second semiconductor region 22 and the third semiconductor region 23 in the surface layer portion of the first semiconductor region 21. The fourth semiconductor region 24 has the p-type impurity concentration less than the p-type impurity concentration of the second semiconductor region 22 of $p^+$-type.

The current IZ flows into a region between the second semiconductor region 22 and the third semiconductor region 23 so as to bypass the fourth semiconductor region 24 when the reverse bias voltage is applied to the zener diode 9. The current IZ can thereby be suppressed from flowing to the surface layer portion of the first semiconductor region 21, so that a part of the electric charges can be suppressed from being captured by the insulating layer 32. As a result, formation of the impurity level in the insulating layer 32 can be suppressed, so that the semiconductor device 1 capable of suppressing the fluctuation of the breakdown voltage BV can be provided.

Figure 7:
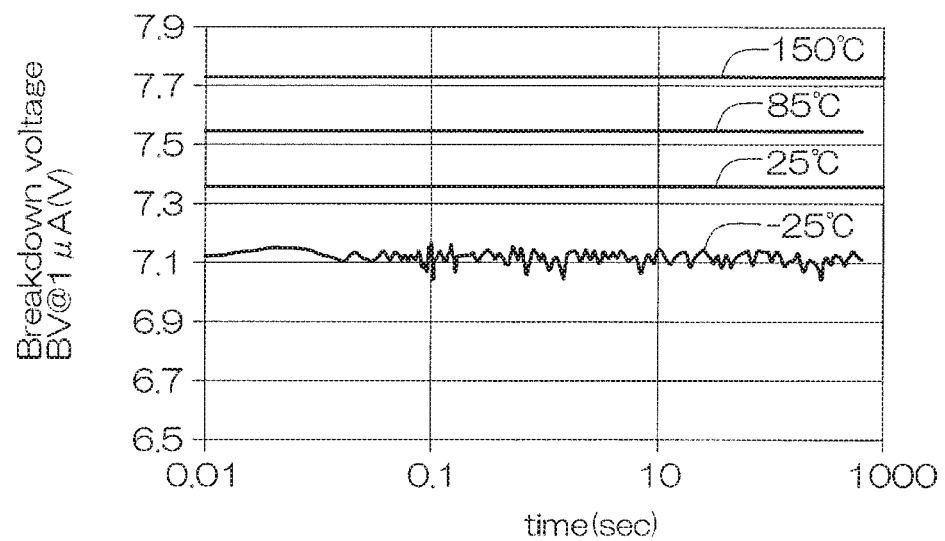
FIG. 7 is a graph obtained by a simulation, and showing a breakdown voltage of the semiconductor device shown in FIG. 1.

FIG. 7 is a graph obtained by a simulation, and showing the breakdown voltage BV of the semiconductor device 1 shown in FIG. 1. The vertical axis represents the breakdown voltage BV [V], and the horizontal axis represents the application time [seconds (sec)] of the reverse bias voltage in FIG. 7.

Here, characteristics of the breakdown voltages BV when temperatures of the semiconductor device 1 were −25° C., 25° C., 85° C. and 150° C. were respectively examined.

Referring to FIG. 7, in the semiconductor device 1, although the breakdown voltage BV was increased depending on the temperatures, even if the reverse bias voltage was continuously applied for 1000 seconds, no significant change in the breakdown voltage BV was observed.

In the semiconductor device 1, the absolute value of the variation rate of the breakdown voltage BV when applying the reverse bias voltage for 1000 seconds was equal to or less than 1%. From this result, it was confirmed that the deterioration over time of the breakdown voltage BV could be suppressed in the semiconductor device 1.

FIGS. 8A to 8H are sectional views for explaining an example of a manufacturing method of the semiconductor device 1 shown in FIG. 1. Hereinafter, the manufacturing steps on aside of the diode region 7 will be explained with referencing FIGS. 8A to 8H.

Firstly, referring to FIG. 8A, the semiconductor layer 2 is prepared. Next, a mask 55 having a predetermined pattern is formed at the first main surface 3 of the semiconductor layer 2. The mask 55 has a plurality of openings 55A. The openings 55A respectively expose regions in which the first trench 12 and the second trench 15 are to be formed.

Next, unnecessary portions of the semiconductor layer 2 are removed by an etching method via the mask 55. The etching method may be a wet etching method. The first trench 12 and the second trench 15 are thereby formed at the first main surface 3 of the semiconductor layer 2. The mask 55 is removed thereafter.

Next, referring to FIG. 8B, the first semiconductor region 21 and the sixth semiconductor region 26 are formed. The step of forming the first semiconductor region 21 includes a step of introducing an n-type impurity into the surface layer portion of the first main surface 3 of the semiconductor layer 2 in the diode region 7. The n-type impurity may be introduced into the semiconductor layer 2 via an ion implantation mask. The first semiconductor region 21 is thereby formed.

The step of forming the sixth semiconductor region 26 includes a step of introducing a p-type impurity into the bottom portion of the first trench 12 and the bottom portion of the second trench 15. The p-type impurity may be introduced into the semiconductor layer 2 via an ion implantation mask. The sixth semiconductor region 26 is thereby formed.

Next, referring to FIG. 8C, the first device separation structure 11 and the second device separation structure 14 are formed. In this step, firstly, an insulating layer which is to be a base of the first insulating layer 13 and the second insulating layer 16 is formed on the first main surface 3 of the semiconductor layer 2. The insulating layer is embedded into the first trench 12 and the second trench 15, and covers the first main surface 3 of the semiconductor layer 2. The insulating layer may be formed by a CVD method.

Next, unnecessary portions of the insulating layer are removed. The unnecessary portions of the insulating layer may be removed by an etching method. The etching method may be a wet etching method. The first device separation structure 11 defining the diode region 7 is thereby formed. The second device separation structure 14 surrounding the first device separation structure 11 is formed.

Figure 8D:
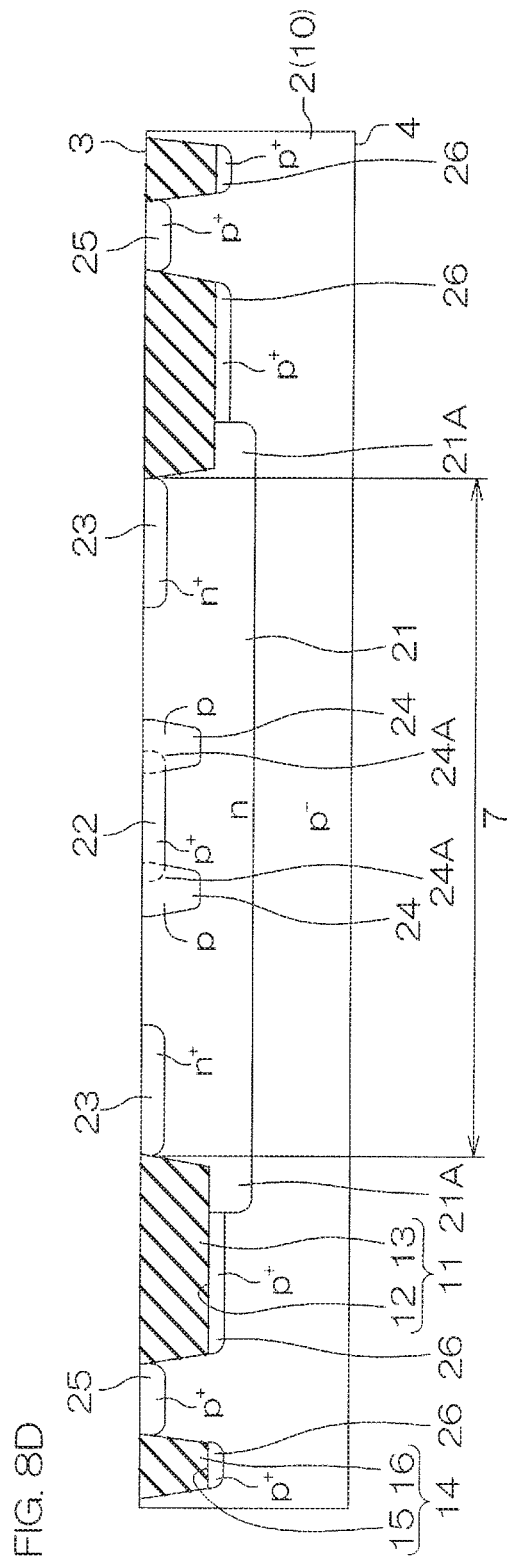

Next, referring to FIG. 8D, the second semiconductor region 22, the third semiconductor region 23, the fourth semiconductor region 24 and the fifth semiconductor region 25 are formed. Here, an example in which the second semiconductor region 22 and the fifth semiconductor region 25 are formed after the formation of the fourth semiconductor region 24 and then the third semiconductor region 23 is formed will be described. The order of formation steps of these regions is arbitrary and is not limited to a specific order.

The step of forming the fourth semiconductor region 24 includes a step of introducing a p-type impurity into the surface layer portion of the first semiconductor region 21. The p-type impurity may be introduced into the surface layer portion of the first semiconductor region 21 via an ion implantation mask. In this step, the p-type impurity is introduced into an annular shape in the plan view at a central portion of the surface layer portion of the first semiconductor region 21. The fourth semiconductor region 24 is thereby formed.

The step of forming the second semiconductor region 22 includes a step of introducing a p-type impurity into the surface layer portion of the first semiconductor region 21. The p-type impurity may be introduced into the surface layer portion of the first semiconductor region 21 via an ion implantation mask. In this step, the p-type impurity is introduced into a central portion of the surface layer portion of the first semiconductor region 21 in the plan view.

The p-type impurity is, more specifically, introduced into a region surrounded by the fourth semiconductor region 24. The p-type impurity is introduced into a region between the first main surface 3 of the semiconductor layer 2 and the bottom portion of the fourth semiconductor region 24 regarding a thickness direction of the semiconductor layer 2. The p-type impurity is also introduced so as to be in contact with the fourth semiconductor region 24. The second semiconductor region 22 is thereby formed.

The fifth semiconductor region 25 is formed simultaneously with the second semiconductor region 22. The step of forming the fifth semiconductor region 25, more specifically, includes a step of introducing the p-type impurity into the surface layer portion of the semiconductor layer 2 via the ion implantation mask commonly used to the second semiconductor region 22.

The p-type impurity is introduced into a region between the first device separation structure 11 and the second device separation structure 14 in the surface layer portion of the semiconductor layer 2. The fifth semiconductor region 25 is thereby formed. Of course, the p-type impurity may be introduced into the surface layer portion of the semiconductor layer 2 via an ion implantation mask different form the ion implantation mask of the second semiconductor region 22 in the step of forming the fifth semiconductor region 25.

The step of forming the third semiconductor region 23 includes a step of introducing an n-type impurity into the surface layer portion of the first semiconductor region 21. The n-type impurity may be introduced into the surface layer portion of the first semiconductor region 21 via an ion implantation mask. In this step, the n-type impurity is introduced along the inner edge of the first device separation structure 11. The n-type impurity is introduced so as to surround the fourth semiconductor region 24 in the plan view. The third semiconductor region 23 is thereby formed.

Next, referring to FIG. 8E, silicide layers 34 are respectively formed in the surface layer portion of the second semiconductor region 22, the surface layer portion of the third semiconductor region 23, and the surface layer portion of the fifth semiconductor region 25.

Next, referring to FIG. 8F, the insulating layer 32 is formed on the first main surface 3 of the semiconductor layer 2. The insulating layer 32 covers a substantially whole region of the diode region 7. The insulating layer 32 may be formed by a CVD method.

Next, unnecessary portions of the insulating layer 32 are removed. The unnecessary portions of the insulating layer 32 may be removed by an etching method via a mask. The contact halls 37 respectively exposing the second semiconductor region 22, the third semiconductor region 23 and the fifth semiconductor region 25 are thereby formed in the insulating layer 32.

Figure 8G:
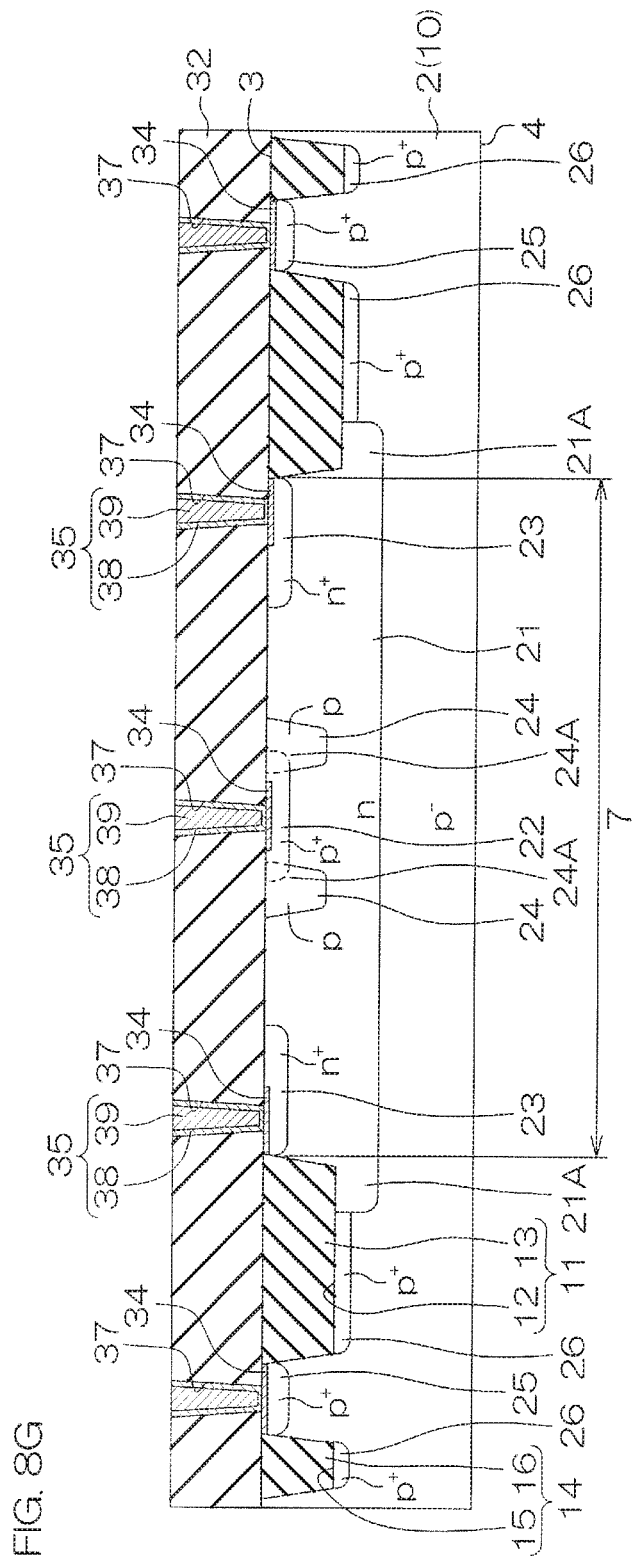

Next, referring to FIG. 8G, the contact electrode layers 35 are respectively formed inside the contact halls 37. In this step, firstly, the base electrode layer 38 is formed. The base electrode layer 38 is formed in a film shape along a surface of the insulating layer 32 and inner wall surfaces of the contact halls 37. The base electrode layer 38 may be formed by a CVD method.

Next, the embedded electrode layer 39 is formed on the base electrode layer 38. The embedded electrode layer 39 is embedded into the contact halls 37 and covers the surface of the insulating layer 32. The embedded electrode layer 39 may be formed by a CVD method. The electrode layer including the base electrode layer 38 and the embedded electrode layer 39 is thereby formed.

Next, the electrode layer including the base electrode layer 38 and the embedded electrode layer 39 is removed until the surface of the insulating layer 32 is exposed. The electrode layer including the base electrode layer 38 and the embedded electrode layer 39 is removed by an etching method. The electrode layer including the base electrode layer 38 and the embedded electrode layer 39 is thereby embedded into the contact halls 37 as the contact electrode layers 35.

Figure 8H:
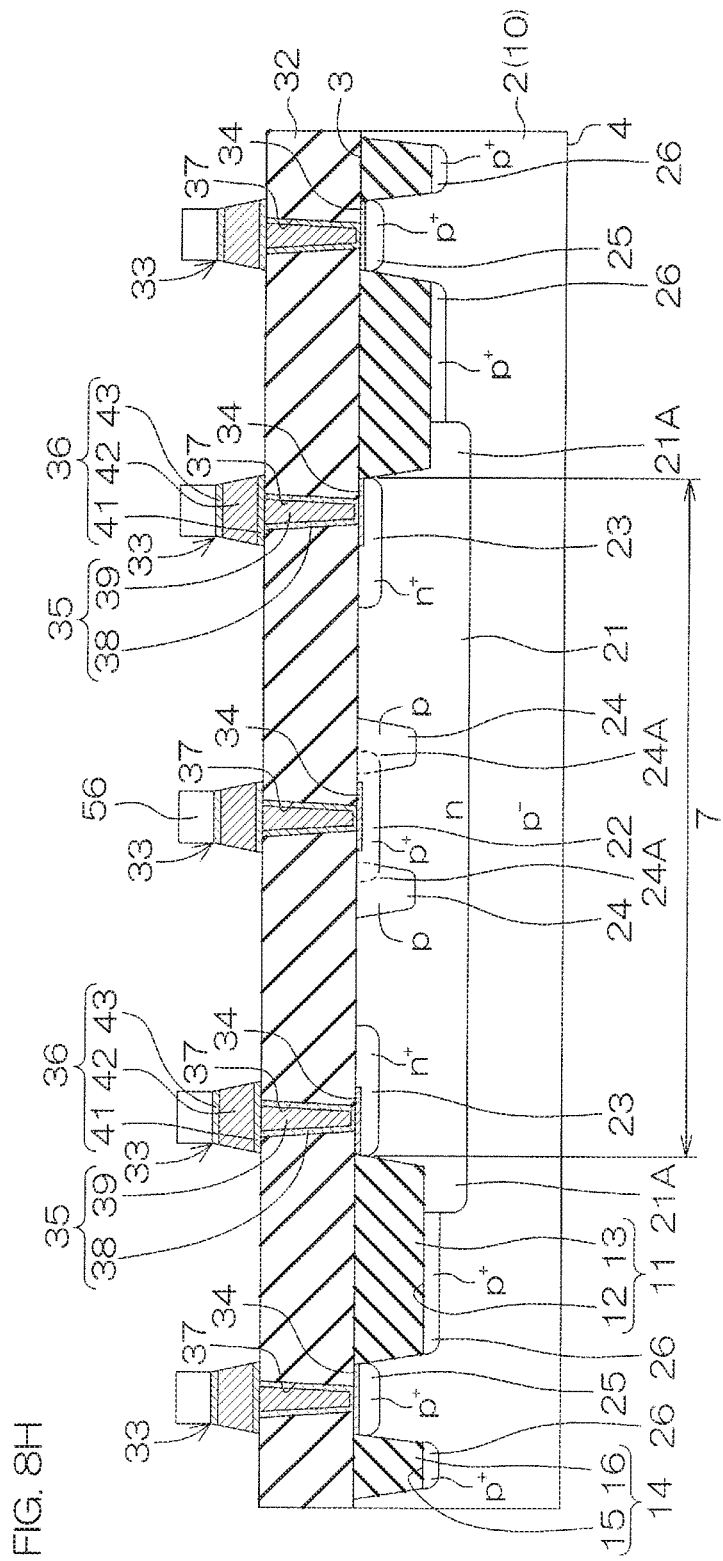

Next, referring to FIG. 8H, the wiring electrode layers 36 covering the contact electrode layers 35 respectively are formed on the insulating layer 32. In this step, firstly, the first electrode layer 41, the second electrode layer 42 and the third electrode layer 43 are formed in this order so as to cover the surface of the insulating layer 32. These electrode layers may be formed by a CVD method respectively. The electrode layer including the first electrode layer 41, the second electrode layer 42 and the third electrode layer 43 is thereby formed.

Next, a mask 56 having a predetermined pattern is formed on the electrode layer including the first electrode layer 41, the second electrode layer 42 and the third electrode layer 43. The mask 56 covers regions in which the wiring electrode layers 36 are to be formed.

Next, unnecessary portions of the electrode layer including the first electrode layer 41, the second electrode layer 42 and the third electrode layer 43 are removed by an etching method via the mask 56. The wiring electrode layers 36 are thereby formed. The mask 56 is removed thereafter. Through the steps including aforementioned, the semiconductor device 1 is manufactured.

Figure 9:
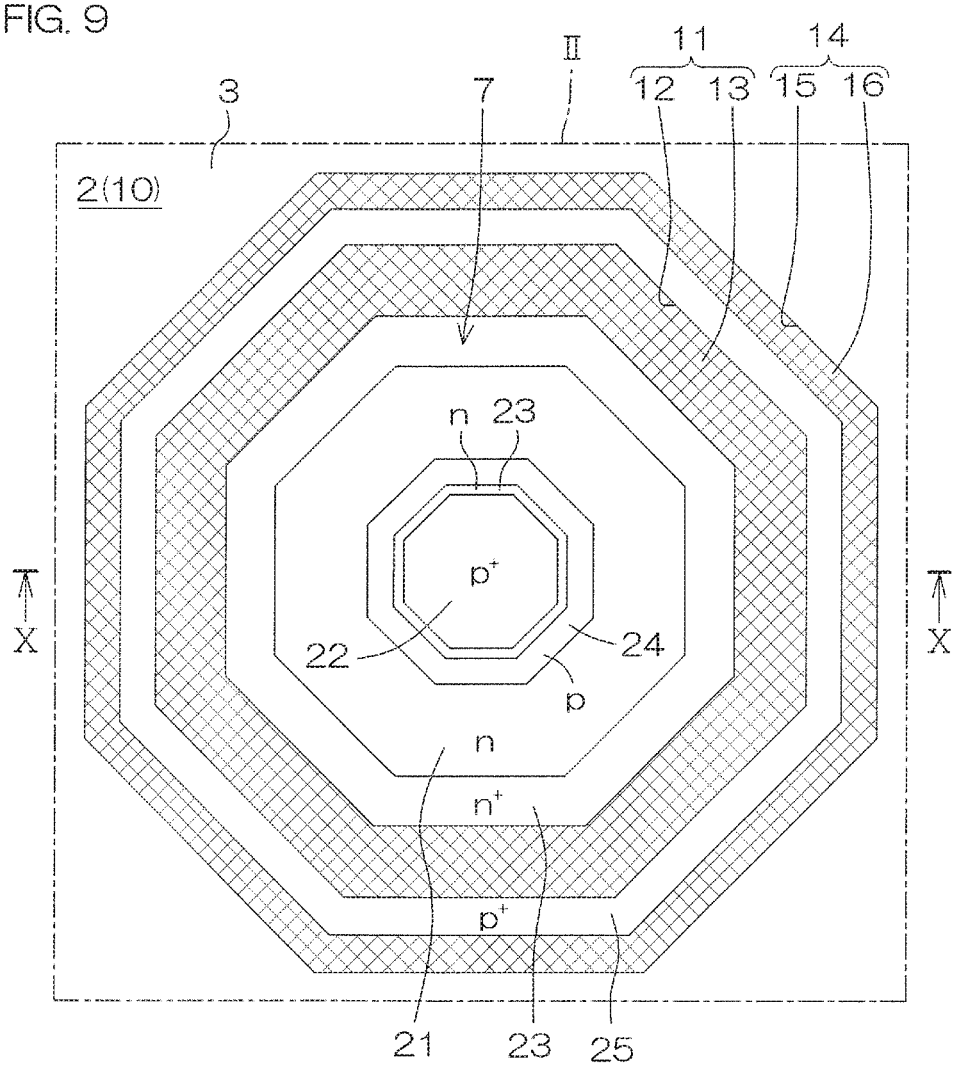
FIG. 9 is an enlarged view showing a region corresponding to the region shown in FIG. 2, and showing a semiconductor device according to a second preferred embodiment of the present invention.
Figure 10:
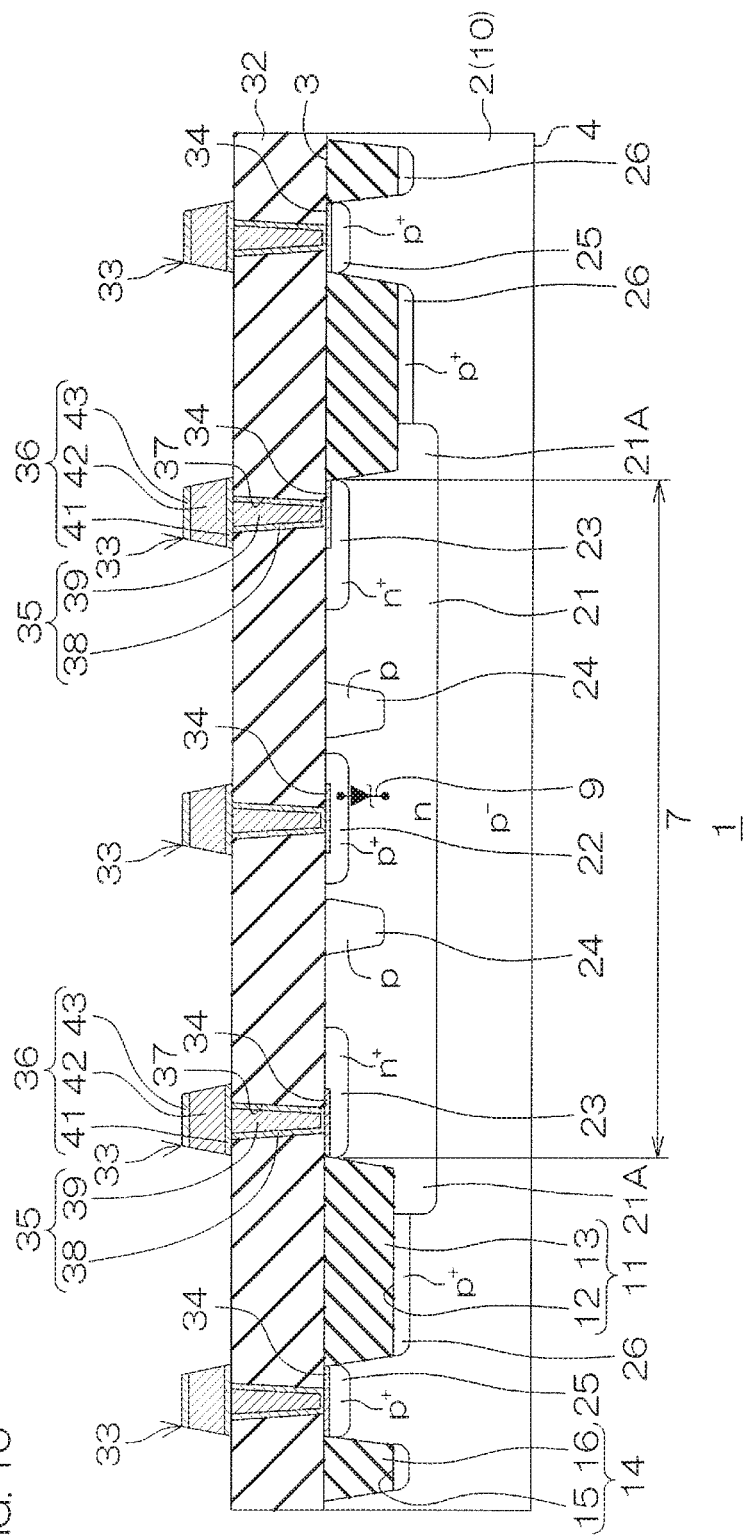
FIG. 10 is a sectional view taken along line X-X shown in FIG. 9.

FIG. 9 is an enlarged view showing a region corresponding to the region shown in FIG. 2, and showing a semiconductor device 61 according to a second preferred embodiment of the present invention. FIG. 10 is a sectional view taken along line X-X shown in FIG. 9.

Hereinafter, the structures corresponding to the structures described for the semiconductor device 1 are denoted by the same reference numeral, and the descriptions thereof are omitted. In FIG. 9, for clarity, the first device separation structure 11 and the second device separation structure 14 are shown by hatchings.

In the semiconductor device 1, the fourth semiconductor region 24 overwraps to the second semiconductor region 22 in the plan view. On the other hand, in the semiconductor device 61, the fourth semiconductor region 24 is formed at interval from the second semiconductor region 22 in the plan view. That is, the fourth semiconductor region 24 does not overwrap to the second semiconductor region 22 in the plan view.

The fourth semiconductor region 24 is formed in the first semiconductor region 21 at intervals from the second semiconductor region 22 and the third semiconductor region 23. The other structures of the fourth semiconductor region 24 are corresponding to the structures of the fourth semiconductor region 24 of the semiconductor device 1. The fourth semiconductor region 24 having such a structure can be formed by merely changing a layout of the ion implantation mask for forming the fourth semiconductor region 24 in the manufacturing method of the semiconductor device 1.

As described above, according to the semiconductor device 61, it is possible to achieve the substantially same effect as the effect described for the semiconductor device 1.

Figure 11:
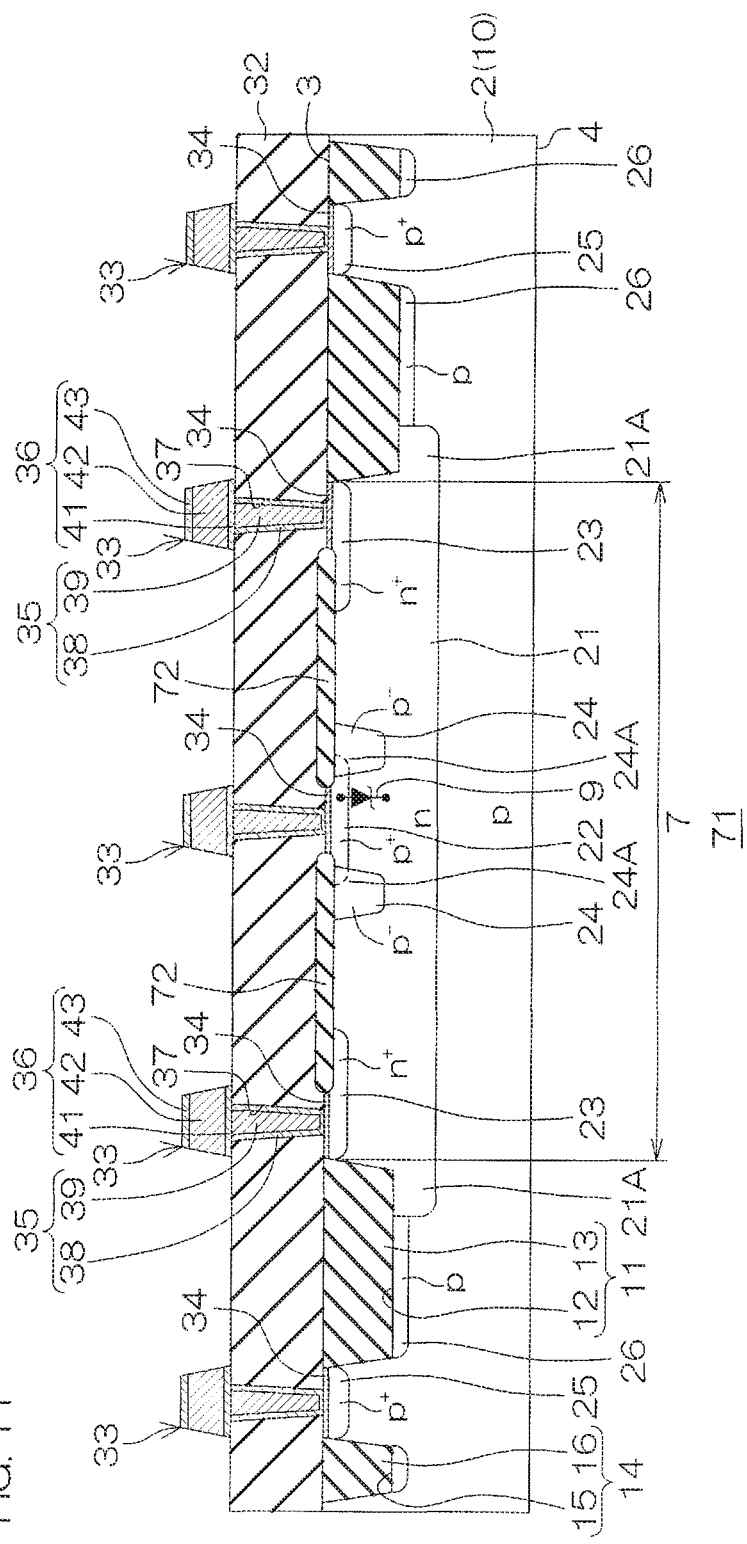
FIG. 11 is a sectional view showing a region corresponding to the region shown in FIG. 3, and showing a semiconductor device according to a third preferred embodiment of the present invention.

FIG. 11 is a sectional view showing a region corresponding to the region shown in FIG. 3, and showing a semiconductor device 71 according to a third preferred embodiment of the present invention. Hereinafter, the structures corresponding to the structures described for the semiconductor device 1 are denoted by the same reference numeral, and the descriptions thereof are omitted.

The semiconductor device 71 further includes a field insulating layer 72 interposed in a region between the first main surface 3 of the semiconductor layer 2 and the insulating layer 32 at the diode region 7. The field insulating layer 72 selectively covers the second semiconductor region 22, the third semiconductor region 23 and the fourth semiconductor region 24 on the first main surface 3 of the semiconductor layer 2. The field insulating layer 72 is formed as a region separation insulating layer separating the second semiconductor region 22 and the third semiconductor region 23. The field insulating layer 72 may include silicon oxide.

A step of forming the field insulating layer 72 may be performed in prior of the step of forming the insulating layer 32 (see FIG. 8F). The field insulating layer 72 may include a Local Oxidation Of Silicon (LOCOS) layer formed by oxidizing the first main surface 3 of the semiconductor layer 2 by a thermal oxidation treatment method.

The field insulating layer 72 may include a CVD insulating layer formed by depositing an insulation material on the first main surface 3 of the semiconductor layer 2 by Chemical Vapor Deposition (CVD) method. The field insulating layer 72 may include a trench insulation structure formed through a step of forming a trench in the first main surface 3 of the semiconductor layer 2 and a step of embedding an insulator into the trench.

As described above, according to the semiconductor device 71, since the current IZ can be suppressed from flowing to the surface layer portion of the first semiconductor region 21, a part of the electric charges can be suppressed from being captured by the field insulating layer 72. The part of the electric charges can be suppressed from being captured by the insulating layer 32 as well. According to the semiconductor device 71, it is therefore possible to achieve the substantially same effect as the effect described for the semiconductor device 1.

Figure 12:
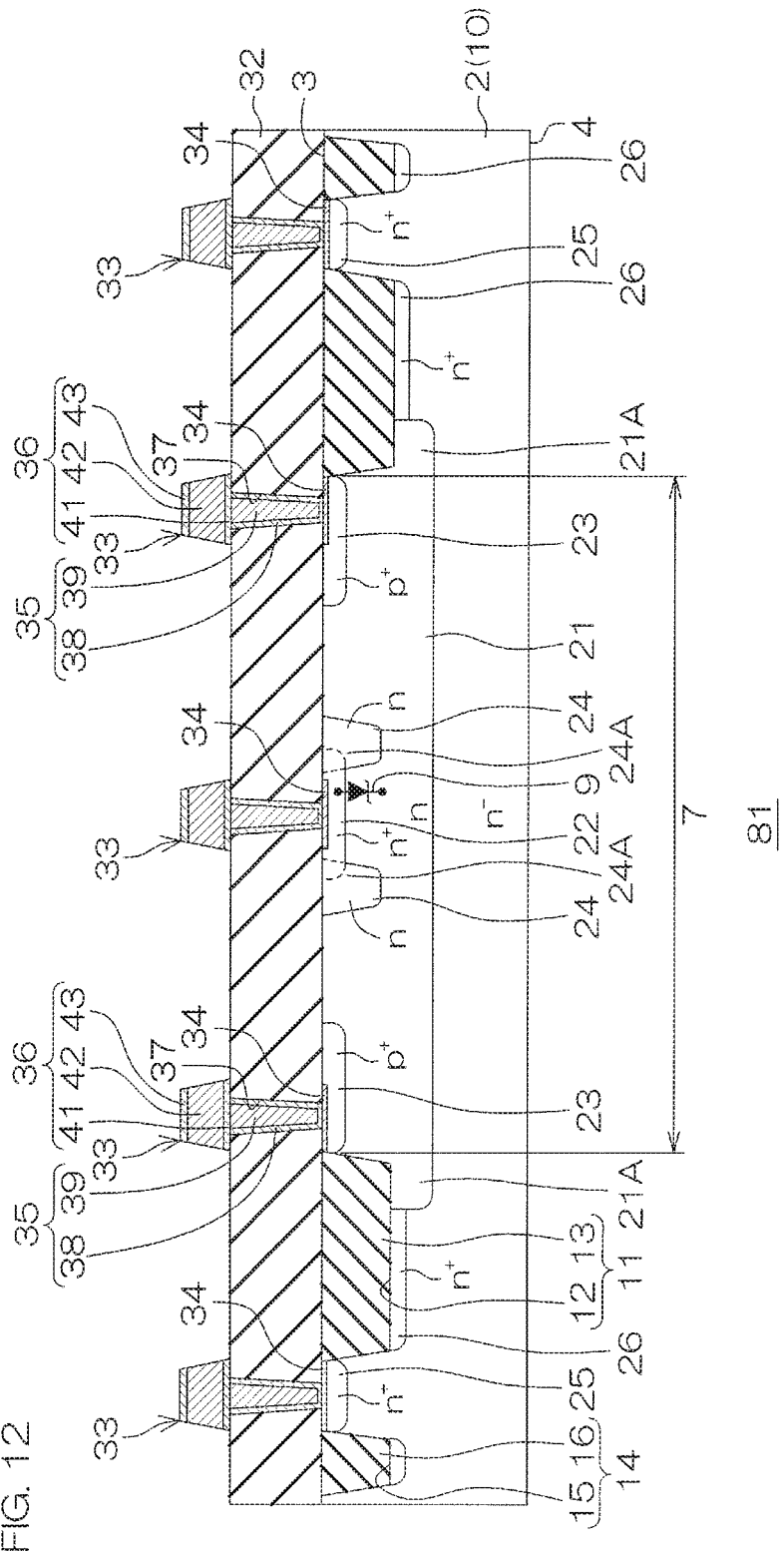
FIG. 12 is a sectional view showing a region corresponding to the region shown in FIG. 3, and showing a semiconductor device according to a fourth preferred embodiment of the present invention.

FIG. 12 is a sectional view showing a region corresponding to the region shown in FIG. 3, and showing a semiconductor device 81 according to a fourth preferred embodiment of the present invention. Hereinafter, the structures corresponding to the structures described for the semiconductor device 1 are denoted by the same reference numeral, and the descriptions thereof are omitted.

Referring to FIG. 12, the semiconductor device 81 has structures in which each semiconductor portions of the semiconductor device 1 according to the first preferred embodiment are inverted. That is, the semiconductor device 81 has structures in which the semiconductor portions of p-type of the semiconductor device 1 according to the first preferred embodiment are inverted into semiconductor portions of n-type, and the semiconductor portions of n-type of the semiconductor device 1 according to the first preferred embodiment are inverted into semiconductor portions of p-type.

The descriptions of the semiconductor device 1 is applied mutatis mutandis to descriptions of the semiconductor device 81 by replacing "n-type", "n$^-$-type" and "n$^+$-type" as "p-type", "p$^-$-type" and "p$^+$-type" respectively, and by replacing "p-type", "p$^-$-type" and "p$^+$-type" as "n-type", "n$^-$-type" and "n$^+$-type" respectively.

As described above, according to the semiconductor device 81, it is possible to achieve the substantially same effect as the effect described for the semiconductor device 1. This structure is also applicable to the semiconductor device 61 according to the second preferred embodiment and the semiconductor device 71 according to the third preferred embodiment.

Although the preferred embodiments of the present invention have been described, the present invention can be implemented in still other embodiments.

Figure 13:
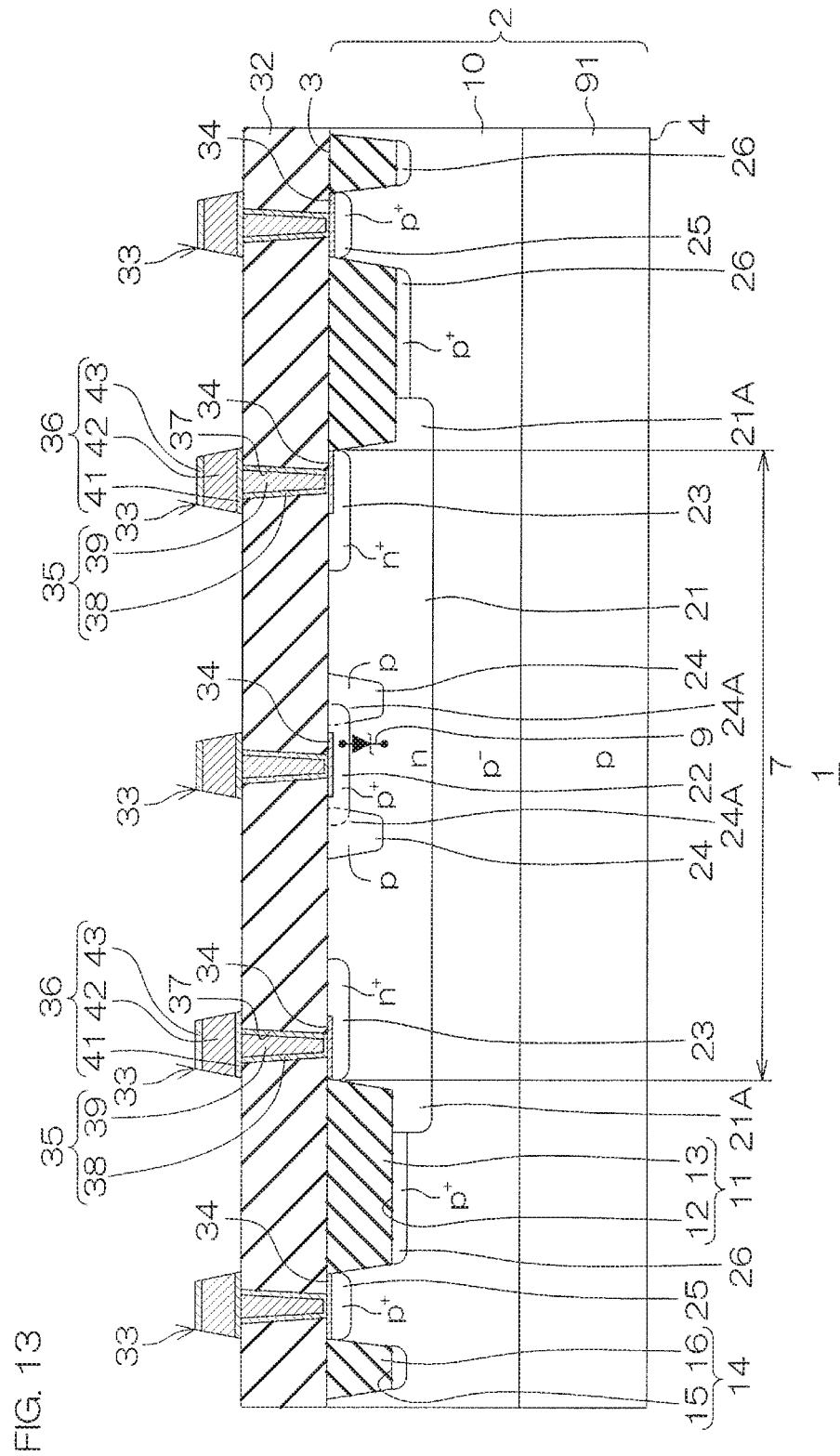
FIG. 13 is a sectional view showing a region corresponding to the region shown in FIG. 3, and showing a modified example of a semiconductor layer.

An example in which the semiconductor layer 2 includes the semiconductor substrate 10 of p-type is described in the first preferred embodiment. However, the semiconductor layer 2 as shown in FIG. 13 may be adopted. FIG. 13 is a sectional view showing a region corresponding to the region shown in FIG. 3, and showing a modified example of the semiconductor layer 2. Hereinafter, the structures corresponding to the structures described for the semiconductor device 1 are denoted by the same reference numeral, and the descriptions thereof are omitted.

Referring to FIG. 13, the semiconductor layer 2 has a laminated layer structure including the semiconductor substrate 10 of p-type, and an epitaxial layer 91 of p$^-$-type formed on the semiconductor substrate 10 of p-type. The second main surface 4 of the semiconductor layer 2 is formed by the semiconductor substrate 10 of p-type. The first main surface 3 of the semiconductor layer 2 is formed by the epitaxial layer 91 of p$^-$type.

The first device separation structure 11, the second device separation structure 14, the first semiconductor region 21, etc., are formed in a surface layer portion of the epitaxial layer 91 of p$^-$type. The semiconductor layer 2 having such a structure can also be applied to the above-described second preferred embodiment, third preferred embodiment and fourth preferred embodiment.

While preferred embodiments of the present invention have been described in detail above, these are merely specific examples used to clarify the technical content of the present invention, and the present invention should not be interpreted as being limited to these specific examples, and the scope of the present invention shall be limited only by the appended claims.

What is claimed is:

1. A semiconductor device comprising:
   a semiconductor layer having a main surface;
   a first semiconductor region of a first conductivity type formed in a surface layer portion of the main surface of the semiconductor layer;
   a second semiconductor region of a second conductivity type formed in a surface layer portion of the first semiconductor region and forming a zener diode with the first semiconductor region;

a third semiconductor region of the first conductivity type formed in the surface layer portion of the first semiconductor region separated from the second semiconductor region;

a single fourth semiconductor region of the second conductivity type formed in a region between the second semiconductor region and the third semiconductor region in the surface layer portion of the first semiconductor region and having a second conductivity type impurity concentration less than a second conductivity type impurity concentration of the second semiconductor region; and an insulating layer formed on the main surface of the semiconductor layer and covering the second semiconductor region, the third semiconductor region and the single fourth semiconductor region;

wherein the single fourth semiconductor region is formed in an annular shape completely surrounding the second semiconductor region when viewed in a plan view, and is connected to a peripheral portion of the second semiconductor region.

2. The semiconductor device according to claim 1, wherein the single fourth semiconductor region is connected to the second semiconductor region.

3. The semiconductor device according to claim 1, wherein the single fourth semiconductor region has a bottom portion positioned in a region of a side of a bottom portion of the first semiconductor region with respect to a bottom portion of the second semiconductor region.

4. The semiconductor device according to claim 1, wherein the single fourth semiconductor region surrounds the second semiconductor region when viewed in plan.

5. The semiconductor device according to claim 1, wherein the third semiconductor region surrounds the second semiconductor region when viewed in plan.

6. The semiconductor device according to claim 1 further comprising:

a device separation structure defining a device forming region at the main surface of the semiconductor layer;

wherein the first semiconductor region is formed in the surface layer portion of the main surface of the semiconductor layer at the device forming region.

7. The semiconductor device according to claim 6, wherein the device separation structure has a trench insulation structure including a trench formed in the main surface of the semiconductor layer, and an insulator embedded in the trench.

8. The semiconductor device according to claim 1, wherein the second semiconductor region is formed in an octagonal shape when viewed in a plan view, and the single fourth semiconductor region is formed in an octagonal annular shape surrounding the second semiconductor region when viewed in a plan view.

* * * * *